(12) United States Patent
Natsuaki et al.

(10) Patent No.: US 10,707,369 B2
(45) Date of Patent: Jul. 7, 2020

(54) AVALANCHE PHOTODIODE

(71) Applicant: SHARP KABUSHIKI KAISHA, Sakai, Osaka (JP)

(72) Inventors: Kazuhiro Natsuaki, Sakai (JP); Takahiro Takimoto, Sakai (JP); Masayo Uchida, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/345,613

(22) PCT Filed: Sep. 26, 2017

(86) PCT No.: PCT/JP2017/034789
§ 371 (c)(1),
(2) Date: Apr. 26, 2019

(87) PCT Pub. No.: WO2018/088047
PCT Pub. Date: May 17, 2018

(65) Prior Publication Data
US 2019/0280145 A1    Sep. 12, 2019

(30) Foreign Application Priority Data
Nov. 9, 2016  (JP) .................... 2016-218553

(51) Int. Cl.
*H01L 31/107* (2006.01)
*H01L 29/06* (2006.01)
(Continued)

(52) U.S. Cl.
CPC ........ *H01L 31/107* (2013.01); *H01L 29/0642* (2013.01); *H01L 31/0203* (2013.01); *H01L 31/02027* (2013.01); *H01L 31/02363* (2013.01)

(58) Field of Classification Search
CPC .......... H01L 31/02027; H01L 31/0203; H01L 31/02363; H01L 31/107
(Continued)

(56) References Cited

U.S. PATENT DOCUMENTS 4,646,124 A * 2/1987 Zunino ............... H01L 27/0623
                                                                257/370
4,831,430 A * 5/1989 Umeji ................ H01L 27/1443
                                                                257/463

(Continued)

*Primary Examiner* — Jay C Kim
(74) *Attorney, Agent, or Firm* — ScienBiziP, P.C.

(57) ABSTRACT

An avalanche photodiode according to the present invention includes, inside a substrate semiconductor layer having a first conductivity type and a uniform impurity concentration, a first semiconductor layer having the first conductivity type, a second semiconductor layer having a second conductivity type, a third semiconductor layer having the second conductivity type, a fourth semiconductor layer having the second conductivity type, a fifth semiconductor layer having the first conductivity type and formed at a position away from the third semiconductor layer in a lateral direction, a sixth semiconductor layer having the second conductivity type, a first contact, and a second contact. The first semiconductor layer is positioned just under the second semiconductor layer and the fifth semiconductor layer in contact therewith. An avalanche phenomenon is caused at a junction between the first semiconductor layer and the second semiconductor layer.

5 Claims, 9 Drawing Sheets

(51) Int. Cl.
*H01L 31/02* (2006.01)
*H01L 31/0203* (2014.01)
*H01L 31/0236* (2006.01)

(58) Field of Classification Search
USPC .................................................. 257/186
See application file for complete search history.

(56) References Cited

U.S. PATENT DOCUMENTS

| | | | | |
|---|---|---|---|---|
| 4,947,231 A * | 8/1990 | Palara | ................... | H01L 21/761 257/539 |
| 5,162,887 A * | 11/1992 | Dierschke | ......... | H01L 27/14647 257/463 |
| 5,245,211 A * | 9/1993 | Paparo | ................ | H01L 27/0248 257/337 |
| 5,252,851 A * | 10/1993 | Mita | ................... | H01L 27/1443 257/446 |
| 5,283,460 A * | 2/1994 | Mita | ................... | H01L 27/1443 257/432 |
| 5,382,824 A * | 1/1995 | Popovic | .............. | H01L 27/1443 257/464 |
| 5,418,396 A * | 5/1995 | Mita | ................... | H01L 27/1443 257/461 |
| 5,466,962 A * | 11/1995 | Yamamoto | ......... | C04B 20/1077 257/437 |
| 5,567,974 A * | 10/1996 | Yoshitake | ........... | H01L 27/1446 257/443 |
| 5,602,415 A * | 2/1997 | Kubo | ................. | H01L 27/1443 257/443 |
| 5,770,872 A * | 6/1998 | Arai | ...................... | H01L 31/103 257/257 |
| 5,889,315 A * | 3/1999 | Farrenkopf | ........... | H01L 21/761 257/552 |
| 6,049,118 A * | 4/2000 | Nagano | ............... | H01L 27/1443 257/187 |
| 6,146,957 A * | 11/2000 | Yamasaki | ........... | H01L 21/8228 438/326 |
| 6,252,286 B1 * | 6/2001 | Arai | ........................ | G11B 7/13 257/446 |
| 6,313,484 B1 * | 11/2001 | Ohkubo | .............. | H01L 27/1443 257/343 |
| 6,376,871 B1 * | 4/2002 | Arai | .................... | H01L 27/1443 257/290 |
| 6,380,602 B1 * | 4/2002 | Fujisawa | ............. | H01L 27/1443 257/461 |
| 6,380,603 B1 * | 4/2002 | Takimoto | .............. | H01L 27/144 257/461 |
| 6,433,366 B1 * | 8/2002 | Takimoto | .............. | H01L 27/144 257/431 |
| 6,433,374 B1 * | 8/2002 | Fukunaga | ......... | H01L 27/14609 257/291 |
| 6,590,273 B2 * | 7/2003 | Okawa | ................ | H01L 27/0664 257/505 |
| 6,677,656 B2 * | 1/2004 | François | ............. | H01L 27/1443 257/225 |
| 6,791,153 B2 * | 9/2004 | Kashiura | ........... | H01L 27/14609 257/458 |
| 7,235,831 B2 * | 6/2007 | Kozuka | ............. | H01L 27/14603 257/222 |
| 7,297,590 B2 * | 11/2007 | Muller | .................. | H01L 27/144 257/463 |
| 7,619,299 B2 * | 11/2009 | Mita | ................. | H01L 21/82285 257/555 |
| 7,749,800 B2 * | 7/2010 | Omi | ...................... | H01L 31/103 257/463 |
| 7,863,701 B2 * | 1/2011 | Iwai | ........................ | H01L 31/10 257/431 |
| 7,964,928 B2 * | 6/2011 | Roy | ................... | H01L 27/14641 257/440 |
| 8,030,728 B2 * | 10/2011 | Iwai | .................... | H01L 27/1443 257/432 |
| 8,093,624 B1 * | 1/2012 | Renzi | .................... | H01L 31/107 257/186 |
| 8,779,543 B2 * | 7/2014 | Nemirovsky | ......... | H01L 31/107 257/438 |
| 9,178,100 B2 * | 11/2015 | Webster | .............. | H01L 27/1443 |
| 9,257,589 B2 * | 2/2016 | Niclass | ................. | H01L 31/107 |
| 9,728,667 B1 * | 8/2017 | Johnson | ............ | H01L 31/1075 |
| 10,012,534 B2 * | 7/2018 | Andreou | ............... | H01L 31/107 |
| 10,153,310 B2 * | 12/2018 | Zhang | ................. | H01L 27/1443 |
| 10,436,581 B2 * | 10/2019 | Lee | .......................... | G01C 3/02 |
| 2010/0019295 A1 | 1/2010 | Henderson et al. | | |
| 2010/0245809 A1 | 9/2010 | Andreou et al. | | |
| 2013/0193546 A1 | 8/2013 | Webster et al. | | |
| 2014/0191115 A1 * | 7/2014 | Webster | ................ | H01L 31/107 250/214 R |
| 2016/0218236 A1 | 7/2016 | Dhulla et al. | | |

* cited by examiner

AVALANCHE PHOTODIODE

CROSS REFERENCE TO RELATED APPLICATION

This application claims the benefit of priority based on Japanese Patent Application No. 2016-218553 filed Nov. 9, 2016, and the entire contents of the Japanese Patent Application are incorporated herein by reference.

TECHNICAL FIELD

The present invention relates to an avalanche photodiode, and more particularly to an avalanche photodiode that causes an avalanche phenomenon and operates in a Geiger mode when a reverse bias voltage equal to or higher than a breakdown voltage is applied.

BACKGROUND ART

An infrared laser having a wavelength of 850 nm or 940 nm is used in fields such as optical communications, time-of-flight (TOF) measurement, and on-vehicle imaging laser radars (also called SPAD LIDAR (Single Photon Avalanche Diode Light Detection And Ranging)). This is because, if irradiation light is visible light, there arises a problem that a malfunction may generate due to natural light (visible light) present in environments, or that the irradiation light is visually recognizable and the device operation is annoying to users. On the other hand, infrared light does not cause such a problem and is safer to the eyes because light energy is low. For that reason, the infrared laser having the wavelength of 850 nm or 940 nm is used as described above. In the above-mentioned circumstance, an avalanche photodiode with high efficiency of photon detection has attracted attention as a light receiving element that detects weak infrared light of 850 nm or 940 nm at high speed.

When a reverse bias voltage lower than the breakdown voltage is applied, the avalanche photodiode operates in a linear mode, and an output current varies depending on an amount of received light with a positive correlation. On the other hand, when a reverse bias voltage equal to or higher than the breakdown voltage is applied, the avalanche photodiode operates in a Geiger mode. Because the avalanche photodiode in the Geiger mode causes the avalanche phenomenon (avalanche amplification effect) even with incidence of one photon, a large output current is obtained. Therefore, the avalanche photodiode in the Geiger mode is also called a SPAD (Single Photon Avalanche Diode). In the Geiger mode, the avalanche photodiode is controlled such that, with application of a voltage between a cathode and an anode, electric field intensity of $3.0 \times 10^5$ V/cm or higher is generated at a junction where the avalanche phenomenon occurs. Charges generated by weak light near the junction are amplified under the above-mentioned control. Thus, the avalanche photodiode can react with a very small input signal corresponding to one photon and can output an electric signal. Furthermore, the avalanche photodiode reacts with an optical signal in a very short time of about several picoseconds and has high time resolution.

Under the above-described situations, the applicant has previously proposed, as one type of SPAD, a SPAD (entirety of which is denoted by reference sign 100) having a structure illustrated in FIG. 8 and being integral with a CMOS (Complementary Metal Oxide Semiconductor) (see Japanese Patent Application No. 2015-235026). The SPAD 100 includes an N-diffusion layer 111 formed inside a P-type substrate (silicon) 110 and spreading in a lateral direction, a P-well 112 (depth of about 0.5 μm) formed on the N-diffusion layer 111 in contact therewith, a $P^+$-layer 113 formed in a shallow portion of the P-well 112, an N-well 115 formed inside the P-type substrate 110 in contact with the N-diffusion layer 111 at a position away from the P-well 112 in the lateral direction, and an $N^+$-layer 116 formed in a shallow portion of the N-well 115. The N-well 115 is arranged inside the P-type substrate 110 to surround the P-well 112 from opposite sides spaced in the lateral direction (see FIG. 9). A region between the N-well 115 and the P-well 112 inside the P-type substrate 110 is an $N^{--}$-region 114 having a low concentration. A region of STI (Shallow Trench Isolation) 121 made of a buried oxide film for element isolation is formed along each of both sides (inner and outer peripheral sides) of a surface portion of the N-well 115. On the $P^+$-layer 113 and the $N^+$-layer 116, an anode contact electrode (aluminum) 131 and a cathode contact electrode (aluminum) 132 are disposed respectively in ohmic contact with them. Moreover, a silicon oxide film ($SiO_2$) 122, a polysilicon electrode 133, a silicon nitride film ($Si_3N_4$) 123, an inter-layer insulating film 124, a light shield film (AlCu) 125, a silicon oxide film ($SiO_2$) 126, and a silicon nitride film ($Si_3N_4$) 127 are successively laminated on the P-type substrate 110 in the mentioned order.

In the SPAD 100, as schematically illustrated in FIG. 9, the avalanche phenomenon is generated by applying a high electric field to a junction AJ between the N-diffusion layer 111 and the P-well 112. More specifically, a signal line is connected to the anode contact electrode 131, and a constant voltage (e.g., about 10 to 30 V) is applied to the cathode contact electrode 132. The P-type substrate 110 is held at a ground potential. Thus, voltages are applied between the N-diffusion layer 111 and the P-well 112 and between the N-diffusion layer 111 and the P-type substrate 110. At that time, between the N-diffusion layer 111 and the P-well 112, because the $P^+$-layer 113 serves as a stopper for a depletion layer and a width of the depletion layer is limited, the electric field intensity is increased in comparison with that between the N-diffusion layer 111 and the P-type substrate 110 (i.e., near a junction NJ), namely to $3 \times 10^5$ [V/cm] or higher. Accordingly, the avalanche phenomenon occurs in a region between the N-diffusion layer 111 and the P-well 112 (i.e., near the junction AJ), and the relevant region functions as an avalanche amplification layer. In other words, when a photon PH is incident on the SPAD 100, the P-well 112 functions as a light detection region and generates a carrier CR by photoelectric conversion. The carrier CR is attracted by the electric field and is drifted to the vicinity of the junction AJ. Because the electric field of $3 \times 10^5$ [V/cm] or higher is applied to the junction AJ as described above, the carrier CR is amplified 10,000 times or more by avalanche amplification. As a result, a large output signal can be taken out even with incidence of one photon.

CITATION LIST

Patent Literature

PTL 1: Specification of U.S. Pat. No. 9,178,100

SUMMARY OF INVENTION

Technical Problem

In the SPAD 100 illustrated in FIG. 9, at the junction AJ between the N-diffusion layer 111 and the P-well 112, the carrier CR generated by the photoelectric conversion in the P-well 112 contributes as the current. On the other hand, at the junction NJ between the N-diffusion layer 111 and the P-type substrate 110, the carrier generated by the photoelectric conversion in a portion of the P-type substrate 110 lower than the N-diffusion layer 111 contributes as the current. The junction to which the electric field of $3\times10^5$ [V/cm] or higher, i.e., at a level capable of causing the avalanche amplification, is only the junction AJ, and the carrier contributing to the avalanche amplification is generated only within the P-well 112. The depth of the P-well 112 is set to about 0.5 μm (see a depthwise concentration profile illustrated in FIG. 10). As mentioned at the beginning, the infrared light having the wavelength of 850 nm or 940 nm is used in the fields of TOF sensors, etc. As seen from FIG. 11 (representing dependence, on depth, of the absorbance of light having a wavelength λ=940 nm and coming into silicon), only about 2% of the incident light is absorbed in the P-well 112 having the depth of 0.5 μm, and remaining 98% passes through the P-well 112 toward the substrate side. Therefore, the above-described SPAD 100 has the problem that photon detection efficiency (P.D.E) for the infrared light is low and light sensitivity is low.

Meanwhile, a SPAD (entirety of which is denoted by reference sign 400) having a structure illustrated in FIG. 12 is known as disclosed in PTL 1 (Specification of U.S. Pat. No. 9,178,100). The SPAD 400 includes a P-type epitaxial substrate 401. A P-type epitaxial layer 402 in the P-type epitaxial substrate 401 has such a concentration gradient as gradually decreasing toward its surface. Within the P-type epitaxial layer 402, there are a deep N-well 406, P-wells 416 and 422 formed to surround the deep N-well 406 from opposite sides spaced in the lateral direction, an N-well 408 formed on the deep N-well 406 in contact therewith, P$^+$-layers 418 and 424 formed respectively in shallow portions of the P-wells 416 and 422, and an N$^+$-layer 410 formed in a shallow portion of the N-well 408. On the P$^+$-layers 418 and 424, anode contact electrodes 420 and 426 are disposed respectively in ohmic contact with them. On the N$^+$-layer 410, a cathode contact electrode 412 is disposed. Gaps between each of the deep N-well 406 and the N-well 408 and each of the P-wells 416 and 422 serve as guard ring regions and act to suppress the electric field from concentrating in an outer peripheral portion of the element, thus generating a uniform electric field at a junction 414 between the P-type epitaxial layer 402 and the deep well 406.

In the SPAD 400, as schematically illustrated in FIG. 13, the junction 414 between the deep N-well 406 and the P-type epitaxial layer 402 causes the avalanche phenomenon and functions as an avalanche amplification layer. Accordingly, in the SPAD 400, not only the N-well 408, but also both a substrate portion (P-type substrate) 401B of the P-type epitaxial substrate 401 and the P-type epitaxial layer 402 function as the light detection regions. As a result, contribution of infrared light having a longer penetration length can be obtained, and light sensitivity can be increased.

In manufacturing of the SPAD 400, however, a thickness of the P-type epitaxial layer 402 varies about 10%, and a concentration at the junction 414 between the deep N-well 406 and the P-type epitaxial layer 402 also varies. More specifically, as the thickness of the P-type epitaxial layer 402 increases, the concentration in the P-type epitaxial layer 402 decreases, and as the thickness of the P-type epitaxial layer 402 decreases, the concentration in the P-type epitaxial layer 402 increases. Furthermore, in general, a variation in concentration occurred in an epitaxial growth process performed by an epitaxial growth apparatus is also large. Consequently, the SPAD 400 has the problem that the photon detection efficiency, i.e., the light sensitivity, varies.

PTL 1 further discloses a SPAD (entirety of which is denoted by reference sign 400A) having a structure illustrated in FIG. 14. In the SPAD 400A, a P-type substrate 401A having a uniform concentration is used instead of the P-type epitaxial layer 402 having the concentration gradient, which is illustrated in FIG. 12. Moreover, a P-type enhancement implant layer 405 is interposed between the P-type substrate 401A and the deep N-well 406. In the SPAD 400A, the vicinity of a junction 414A between the deep N-well 406 and the P-type enhancement implant layer 405 causes the avalanche phenomenon and functions as the avalanche amplification layer. The SPAD 400A can suppress a variation in light sensitivity because the P-type substrate 401A having the uniform concentration is used.

However, the SPAD 400A has the problem that internal resistance (particularly, anode resistance) is high because the P-well 422 and the P-type enhancement implant layer 405 are quite apart from each other. Thus, when the SPAD 400A is operated in the Geiger mode, the high internal resistance functions as quenching resistance. More specifically, even when the carrier generated in the SPAD 400A by the photoelectric conversion is avalanche-amplified in the avalanche amplification layer (i.e., in the vicinity of the junction 414A between the deep N-well 406 and the P-type enhancement implant layer 405), a voltage drop through the internal resistance (particularly, the anode resistance) is large, and hence the electric field intensity of $3\times10^5$ [V/cm] or higher cannot be obtained near the junction 414A. This raises the problem that the current cannot be increased over a certain level, namely that a maximum amplification current cannot be increased.

In consideration of the above-described state of the art, an object of the present invention is to provide an avalanche photodiode which has stable and high light sensitivity, which has low internal resistance, and which can increase a maximum amplification current.

Solution to Problem

To solve the above-described problem, according to one aspect of the present invention, there is provided an avalanche photodiode including a first semiconductor layer formed inside a substrate semiconductor layer having a first conductivity type and a uniform impurity concentration, the first semiconductor layer having the first conductivity type and occupying a predetermined region in a lateral direction;

a second semiconductor layer having a second conductivity type opposite to the first conductivity type and formed inside the substrate semiconductor layer on the first semiconductor layer in contact therewith;

a third semiconductor layer having the second conductivity type, the third semiconductor layer being formed inside the substrate semiconductor layer on the second semiconductor layer in contact therewith and having a lower impurity concentration than the second semiconductor layer;

a fourth semiconductor layer having the second conductivity type, the fourth semiconductor layer being formed in a shallow portion of the third semiconductor layer and having a higher impurity concentration than the third semiconductor layer;

a fifth semiconductor layer having the first conductivity type and formed inside the substrate semiconductor layer at a position away from the third semiconductor layer in the lateral direction;

a sixth semiconductor layer having the first conductivity type, the sixth semiconductor layer being formed in a shallow portion of the fifth semiconductor layer and having a higher impurity concentration than the fifth semiconductor layer;

a first contact electrically connected to the fourth semiconductor layer; and a second contact electrically connected to the sixth semiconductor layer, wherein the first semiconductor layer is positioned just under the second semiconductor layer and the fifth semiconductor layer in contact therewith, and an avalanche phenomenon is caused at a junction between the first semiconductor layer and the second semiconductor layer.

Advantageous Effects of Invention

The avalanche photodiode according to the one aspect of the present invention can ensure stable and high light sensitivity, can provide low internal resistance, and can increase a maximum amplification current.

DESCRIPTION OF EMBODIMENTS

Figure 1:
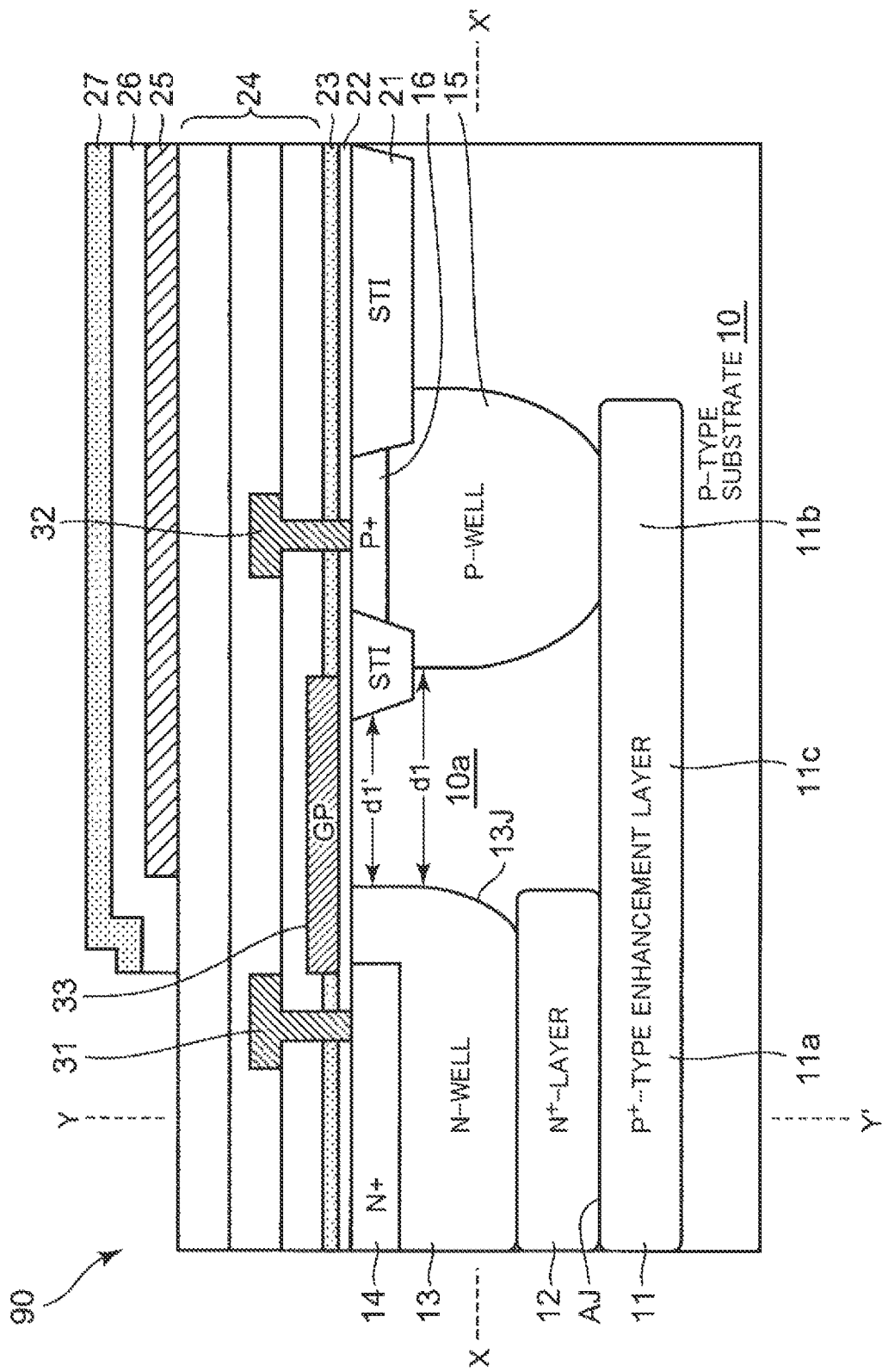
FIG. 1 is a sectional view illustrating a structure of an avalanche photodiode according to a first embodiment of the present invention.

Embodiments of the present invention will be described in detail below with reference to the drawings. In the drawings, the same reference signs denote the same or equivalent components. Dimensions illustrated in the drawings, such as lengths, widths, thicknesses, and depths, are modified as appropriate from actual dimensions for the purpose of clarity and simplification of the drawings, and they do not exactly represent the actual relative dimensions. Furthermore, P-type corresponds to a first conductivity type, and N-type corresponds to a second conductivity type, respectively. "P" and "N" included in names denoting the individual components imply that the corresponding components are P-type and N-type, respectively.

First Embodiment (Structure of Avalanche Photodiode)

FIG. 1 illustrates a sectional structure of an avalanche photodiode (SPAD) 90 according to a first embodiment of the present invention. The SPAD 90 includes a P-type substrate (silicon substrate) 10 that provides a substrate semiconductor layer having a uniform impurity concentration (specific resistance of about 10 Ω·cm). Inside the P-type substrate 10 (over a depth of about 2 μm), there are a P$^+$-type enhancement layer (impurity concentration of about $1\times10^{17}$ cm$^{-3}$) 11 formed to occupy a predetermined region spreading in a lateral direction and serving as a first semiconductor layer, an N$^+$-layer (impurity concentration of about $2\times10^{17}$ cm$^{-3}$) 12 formed on the P$^+$-type enhancement layer 11 in contact therewith and serving as a second semiconductor layer, an N-well (depth of about 2 μm and impurity concentration of about $3\times10^{16}$ cm$^{-3}$) 13 formed in contact with the N$^+$-layer 12 and serving as a third semiconductor layer having a lower impurity concentration than the N$^+$-layer 12, an N$^+$-layer (impurity concentration of about $1\times10^{21}$ cm$^{-3}$) 14 formed in a shallow portion of the N-well 13 and serving as a fourth semiconductor layer having a higher impurity concentration than the N-well 13, a P-well (depth of about 2 μm and impurity concentration of about $3\times10^{16}$ cm$^{-3}$) 15 formed inside the P-type substrate 10 at a position away from the N-well 13 in the lateral direction and serving as a fifth semiconductor layer, and a P$^+$-layer (impurity concentration of about $1\times10^{21}$ cm$^{-3}$) 16 formed in a shallow portion of the P-well 15 and serving as a sixth semiconductor layer. The P-well 15 is annularly arranged to surround the N-well 13 with a spacing held between those cells through a distance d1 (about 2 μm) in the lateral direction inside the P-type substrate 10. A non-doped region 10a having the same impurity concentration as the P-type substrate 10 is present between the N-well 13 and the P-well 15 in the lateral direction inside the P-type substrate 10. A region of STI (Shallow Trench Isolation) 21 made of a buried oxide film for element isolation is formed along each of both sides (inner and outer peripheral sides) of a surface portion of the P-well 15. The STI 21 is positioned away, through a distance d1' (about 1.6 μm), from the N-well 13 in the lateral direction. On the N$^+$-layer 14 and the P$^+$-layer 16, a cathode contact electrode (aluminum) 31 serving as a first contact and an anode contact electrode (aluminum) 32 serving as a second contact are disposed respectively in ohmic contact with them. Moreover, a silicon oxide film (SiO$_2$) 22, a polysilicon electrode 33, a silicon nitride film (Si$_3$N$_4$) 23, an interlayer insulating film 24, a light shield film (AlCu) 25, a silicon oxide film (SiO$_2$) 26, and a silicon nitride film (Si$_3$N$_4$) 27 are successively laminated on the P-type substrate 10 in the mentioned order.

In this embodiment, a first portion 11a of the P$^+$-type enhancement layer 11 locating just under the N$^+$-layer 12 and a second portion 11b of the P$^+$-type enhancement layer 11 locating just under the P-well 15 are connected to each other in the lateral direction through a third portion 11c of the P$^+$-type enhancement layer 11 locating just under the non-doped region 10a.

(Manufacturing Method)

The SPAD 90 is manufactured as follows, for example, by a process resulting from integrating a SPAD process into a CMOS process. First, the regions of STI (Shallow Trench Isolation) 21 are formed at predetermined positions. The P-well 15 and the N-well 13 are formed inside the P-type substrate 10 by ion implantation and thermal diffusion. Then, the P$^+$-type enhancement layer 11 is formed by ion implantation of boron, for example, and the N$^+$-layer 12 is formed by ion implantation of phosphorus, for example. At that time, energy of the ion implantation is set such that the P$^+$-type enhancement layer 11 is located at a position just under the N$^+$-layer 12 and the P-well 15 in contact with them. Furthermore, the P$^+$-layer 16 and the N$^+$-layer 14 are formed by thermal diffusion. Thereafter, the remaining films 22 to 27 and electrodes 31 to 33 are formed by the known CMOS process.

Here, the STI is formed only in the P-well side in a later well-forming process, and it is not formed on the N-well side. The reason is as follows. Because the STI includes many dangling bonds of Si—SiO$_2$ and silicon is distorted with application of stress to the surroundings of the STI, it is thought that the STI includes many recombination centers becoming noise sources. Therefore, if the junction between the N-well and a virtual guard ring layer (10a), to which junction an electric field is applied, is positioned close to the STI, the STI takes in and amplifies recombined electrons, thus increasing noise. Accordingly, it is desired that, from the viewpoint of not dividing the above-mentioned junction by the STI, the STI is not positioned on the N-well side including the junction and is positioned away from the N-well through a predetermined distance. On the other hand, the STI may be or may not be disposed on the P-well side where there is no junction. In order to stabilize a surface concentration of the virtual guard ring layer (10a) and to prevent edge breakdown, i.e., a phenomenon that the SPAD breaks down at a lateral surface, however, a withstand voltage needs to be secured between the gate polysilicon layer 33 and the P-well layer such that a free potential can be applied to the gate polysilicon 33. Thus, the STI layer is desirably disposed at least between the P-well layer and the gate polysilicon layer 33 to increase the distance between the gate polysilicon layer 33 and the P-well, thereby securing the withstand voltage.

In the SPAD 90, the P$^+$-type enhancement layer 11, the P-well 15, and the P-layer 16 function as an anode, while the N-layer 12, the N-well 13, and the N$^+$-layer 14 function as a cathode.

The impurity concentration (about $1 \times 10^{17}$ cm$^{-3}$) of the P$^+$-type enhancement layer 11 and the impurity concentration (about $2 \times 10^{17}$ cm$^{-3}$) of the N$^+$-layer 12 are set such that spreading of a depletion layer is suppressed at the junction AJ between the P$^+$-type enhancement layer 11 and the N$^+$-layer 12 to increase the electric field intensity and to cause the avalanche phenomenon. Here, the concentration of the P$^+$-type enhancement layer is desirably set to be lower than that of the N$^+$-layer. The reason is as follows. If the concentration of the surface side (i.e., the N$^+$-layer side) is relatively low, the depletion layer spreads toward the surface side when the electrical field intensity is increased. Thus, there is a possibility that noise may increase with generation of recombined carriers attributable to dangling bonds in the silicon surface. On the other hand, if the concentration on the substrate side (i.e., in the P$^+$-type enhancement layer) is relatively low, no influences are caused by carriers on the surface side when the electrical field intensity is increased. Thus, there is no need of considering the influences of the recombined carriers on the surface side.

(Advantages)

In the SPAD 90, the junction AJ causing the avalanche phenomenon (i.e., the junction between the P$^+$-type enhancement layer 11 and the N$^+$-layer 12) is present inside the P-type substrate 10 (at the depth of about 2 μm). Therefore, optical carriers attributable to light absorbed inside the P-type substrate 10 (particularly in a portion lower than the P$^+$-type enhancement layer 11 and in the N-well 13) contribute to the avalanche phenomenon and increase photon detection efficiency. As a result, optical sensitivity increases.

Furthermore, as described above, the non-doped region 10a having the same impurity concentration as the P-type substrate 10 is present between the N-well 13 and the P-well 15 in the lateral direction inside the P-type substrate 10. Since the non-doped region 10a has the lower concentration than the P$^+$-type enhancement layer 11 and the P-well 15, the concentrations at the junctions in lateral surfaces of the N$^+$-layer 12 and the N-well 13 are reduced, and electric fields in those lateral surfaces are moderated. It is hence possible to avoid the electric field from increasing only at the lateral surfaces of the N$^+$-layer 12 and the N-well 13 (particularly, the occurrence of the edge breakdown), and to widen the electric field at the junction AJ causing the avalanche phenomenon (i.e., the junction between the P$^+$-type enhancement layer 11 and the N$^+$-layer 12) in the lateral direction. Accordingly, a wide effective area of the junction AJ causing the avalanche phenomenon can be secured, and the photon detection efficiency can be increased. Hence the optical sensitivity can be further increased.

Moreover, the P-type substrate 10 has the uniform impurity concentration. The P$^+$-type enhancement layer 11 and the N$^+$-layer 12 can be formed in a manner of controlling their depths and concentrations by an ion implantation method. Accordingly, a variation in concentration at the junction AJ causing the avalanche phenomenon (i.e., the junction between the P$^+$-type enhancement layer 11 and the N$^+$-layer 12) is reduced, and a variation in manufacturing is reduced. This stabilizes the electric field intensity at the junction AJ casing the avalanche phenomenon. As a result, the optical sensitivity is stabilized.

Still further, in this embodiment, the first portion 11a of the P$^+$-type enhancement layer 11 locating just under the N-layer 12 and the second portion 11b of the P$^+$-type enhancement layer 11 locating just under the P-well 15 are connected to each other in the lateral direction through the third portion 11c of the P-type enhancement layer 11 locating just under the non-doped region 10a. Since the P$^+$-type enhancement layer 11 is a lower resistance layer in comparison with the P-type substrate 10, electrical resistance of a path (including the P$^+$-type enhancement layer 11 and the P-well 15) from the junction AJ causing the avalanche phenomenon (i.e., the junction between the P$^+$-type enhancement layer 11 and the N$^+$-layer 12) to the P$^+$-layer 16 can be significantly reduced. Thus, the internal resistance can be reduced, and the maximum amplification current can be increased.

A junction 13J is present between the lateral surface of the N-well 13 and the P-type substrate 10 (or the non-doped region 10a). The electric field intensity is maximized near the junction 13J. Therefore, if defects exist near the junction 13J, carriers attributable to the defects (recombination centers) generate and jump into that electric field, thus causing noise. The region of STI (Shallow Trench Isolation) 21 for element isolation formed by microprocessing has a structure that an oxide film is buried in the trench form. Accordingly, many defects caused by stress and damage exist around the STI 21. Taking the above point into consideration, in the SPAD 90, the STI 21 is positioned away from the N-well 13 through the distance d1' in the lateral direction. Such a structure can suppress generation of the carriers attributable to the defects (recombination center). Hence noise during operation can be further suppressed. On the other hand, the STI 21 is positioned along an inner periphery (and an outer periphery) of the surface portion of the P-well 15. As a result, the withstand voltage (breakdown voltage) between the N-well 13 and the P-well 15 can be secured.

In addition, the polysilicon electrode 33 is positioned above the non-doped region 10a between the N-well 13 and the P-well 15 with the silicon oxide film 22 interposed between the polysilicon electrode 33 and the non-doped region 10a. The polysilicon electrode 33 is fabricated by utilizing a gate electrode step in the CMOS process. The same potential as that of the cathode contact electrode 31 is applied to the polysilicon electrode 33 during the operation. This avoids the occurrence of an event that the interface between the non-doped region 10a and the silicon oxide film 22 causes N reverse and the depletion layer spreads along the surface to such an extent as joining with the STI 21 disposed at the inner periphery of the silicon oxide film 22 in the surface portion of the P-well 15. Accordingly, the withstand voltage (breakdown voltage) between the N-well 13 and the P-well 15 can be more reliably secured.

(Avalanche Amplification Operation)

An avalanche amplification operation of the SPAD 90 will be described in more detail below. During the operation of the SPAD 90, a constant voltage (e.g., about 10 to 30 V) is applied to the cathode contact electrode 31. Furthermore, a signal line is connected to the cathode contact electrode 31. In addition, the P-type substrate 10 is held at the ground potential. Thus, the above-mentioned constant voltage is applied between the layers serving as the cathode, i.e., the N⁺-layer 12, the N-well 13, and the N-layer 14, and the layers serving as the anode, i.e., the P⁺-type enhancement layer 11, the P-well 15, and the P⁺-layer 16. Consequently, an electric field of $3\times10^5$ [V/cm] is applied to the junction AJ between the P⁺-type enhancement layer 11 and the N⁺-layer 12. On that occasion, between the N-well 13 and the P-well 15, the non-doped region 10a serves as a cushion for spreading of the depletion layer, and a width of the depletion layer increases significantly. Therefore, the electric field intensity becomes lower than that between the N⁺-layer and the P⁺-type enhancement layer. On the other hand, at the junction AJ between the P⁺-type enhancement layer 11 and the N⁺-layer 12, since the impurity concentrations of those layers are set to be relatively high, spreading of the depletion layer is suppressed, and the electric field intensity is increased. As a result, only the junction AJ between the P⁺-type enhancement layer 11 and the N⁺-layer 12 functions as the avalanche amplification layer.

Figure 5:
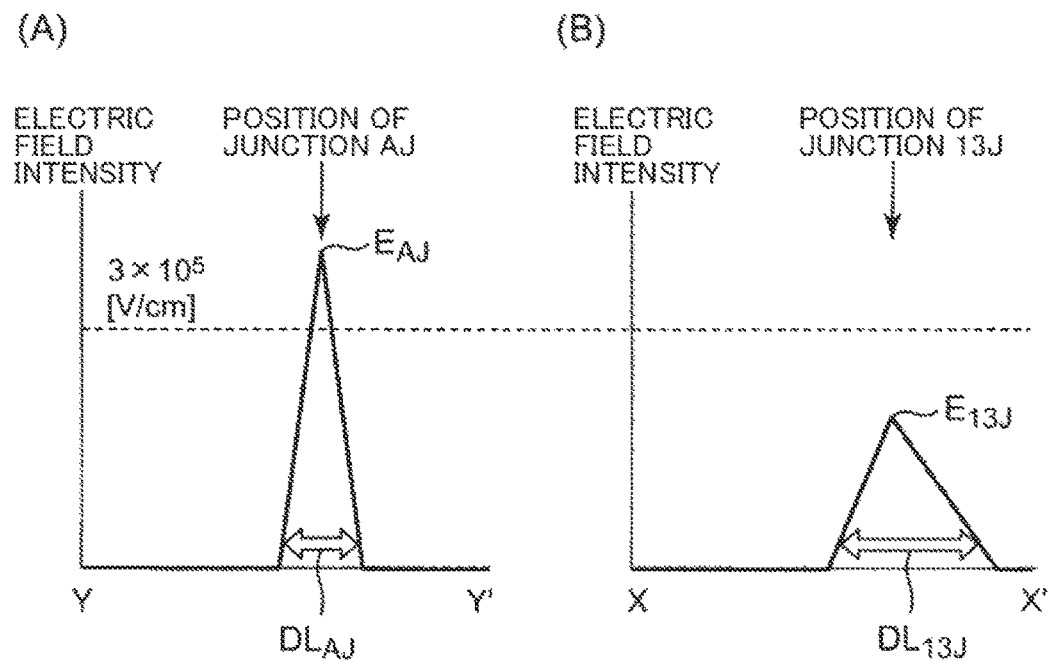
FIGS. 5(A) and 5(B) are graphs representing, respectively, results of measuring distributions of electric field intensity along a line Y-Y' and a line X-X' in FIG. 1.

FIGS. 5(A) and 5(B) represent, respectively, results of actually measuring distributions of electric field intensity along a line Y-Y' and a line X-X' in FIG. 1. As seen from FIGS. 5(A) and 5(B), a peak $E_{AJ}$ of the electric field intensity at the junction AJ present on the line Y-Y' is higher than a peak $E_{13J}$ of the electric field intensity at the junction 13J present on the line X-X'. This is because, as described above, the concentrations and depthwise positions of the P⁺-type enhancement layer 11 and the N⁺-layer 12 are designed such that a depletion layer width $DL_{AJ}$ near the junction AJ is narrower than a depletion layer width $DL_{13J}$ near the junction 13J. Furthermore, as seen from FIGS. 5(A) and 5(B), the electric field intensity exceeds $3\times10^5$ [V/cm] only near the junction AJ that is present on the line Y-Y'. As a result, the SPAD 90 causes the avalanche phenomenon only near the junction AJ and operates in the Geiger mode. The junction 13J present on the line X-X' does not cause the avalanche phenomenon, but it contributes to applying a uniform electric field to the junction AJ between the P⁺-type enhancement layer 11 and the N⁺-layer 12.

When a photon is incident on the SPAD 90, each of inner portions (particularly a lower portion than the P⁺-type enhancement layer 11 and the N-well 13) of the P-type substrate 10 functions as a light detection region and generates a carrier upon absorbing light. The carrier generated upon absorbing the light is attracted by the electric field and is drifted to the junction AJ between the P⁺-type enhancement layer 11 and the N⁺-layer 12. The electric field of $3\times10^5$ [V/cm] or higher is applied to the junction AJ as described above. Near the junction AJ, therefore, the carrier is amplified 10,000 times or more by avalanche amplification. Thus, a large output signal can be taken out even with incidence of one photon.

Furthermore, in the SPAD 90, as described above, the first portion 11a of the P⁺-type enhancement layer 11 locating just under the N⁺-layer 12 and the second portion 11b of the P⁺-type enhancement layer 11 locating just under the P-well 15 are connected to each other in the lateral direction through the third portion 11c of the P⁺-type enhancement layer 11 locating just under the non-doped region 10a. Since the P⁺-type enhancement layer 11 is the lower resistance layer in comparison with the P-type substrate 10, the electrical resistance of the path (including the P⁺-type enhancement layer 11 and the P-well 15) from the junction AJ causing the avalanche phenomenon (i.e., the junction between the P⁺-type enhancement layer 11 and the N⁺-layer 12) to the P⁺-layer 16 can be significantly reduced. Thus, the internal resistance can be reduced, and the maximum amplification current can be increased. Such an advantage will be described in more detail below with reference to FIGS. 2 to 4.

Figure 2:
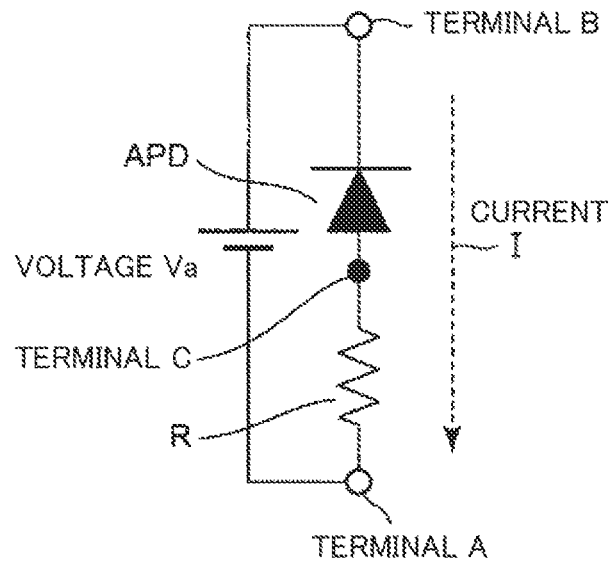
FIG. 2 is a general circuit diagram when an avalanche photodiode is used.

FIG. 2 illustrates, by way of example, a general circuit diagram when an avalanche photodiode APD (including the SPAD 90) is used. In the illustrated circuit, the avalanche photodiode APD and a resistance R, which serves as quenching resistance, are connected in series, and a DC power supply Va is connected to the serially connected components. More specifically, one end of the resistance R is connected to an anode terminal C of the avalanche photodiode APD. A negative electrode of the DC power supply Va is connected to the other end A of the resistance R. A positive electrode of the DC power supply Va is connected to a cathode terminal B of the avalanche photodiode APD.

Figure 3:
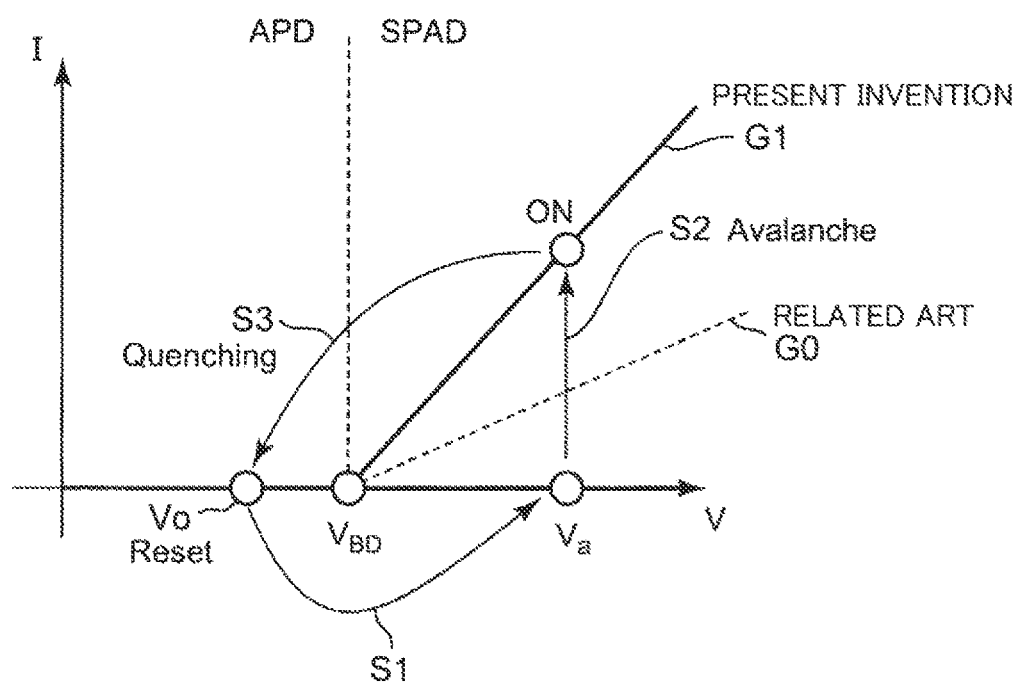
FIG. 3 is a graph representing a relation between a voltage V, which is applied between a cathode terminal and an anode terminal of the avalanche photodiode, and a current I flowing through a circuit.
Figure 4:
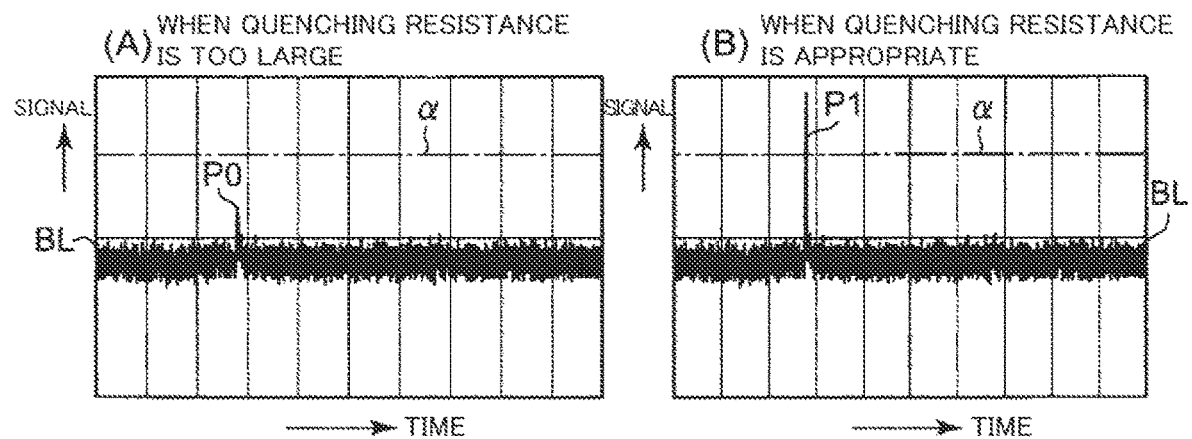
FIG. 4A is a chart representing a result of observing an output of an avalanche photodiode APD with the lapse of time in the case of inputting a pulse in the absence of any input signals when quenching resistance is too large.
FIG. 4B is a chart representing a result of observing an output of the avalanche photodiode APD with the lapse of time in the case of inputting a pulse in the state with no input signals when the quenching resistance is appropriate.

FIG. 3 graphically represents a relation between a voltage V, which is applied between the cathode terminal B and the anode terminal C of the avalanche photodiode APD in FIG. 2, and a current I flowing through the circuit. $V_{BD}$ in a horizontal axis (voltage axis) denotes a breakdown voltage of the avalanche photodiode APD. In FIG. 3, the case of $V<V_{BD}$ (e.g., the case of $V=V_o$) represents the so-called linear mode in which an output current of the avalanche photodiode APD varies depending on an amount of received light with a positive correlation. When the voltage V applied to the avalanche photodiode APD is increased in the absence of any input signals, a voltage state is changed up to V=Va as denoted by arrow S1. In the absence of any input signals, the output signal is not generated. When a small optical signal such as a photon is input, the input signal is amplified, and the current I is once increased up to an ON-state as denoted by arrow S2 (Avalanche), whereby the output signal is obtained. However, the voltage is immediately dropped through the resistance (quenching resistance) R in FIG. 2, and the voltage V applied to the avalanche photodiode APD is reduced as denoted by arrow S3 (Quenching) ($V=V_o<V_{BD}$ in the illustrated example). Thus, the avalanche photodiode APD is returned to a reset state (Reset). By repeating a series of the above-mentioned operations (S1 to S3), the output signal depending on the input signal is obtained (operation in the Geiger mode). When the avalanche photodiode APD is used alone (i.e., without the quenching resistance), it maintains the ON-state and is not returned to the reset state.

Figure 8:
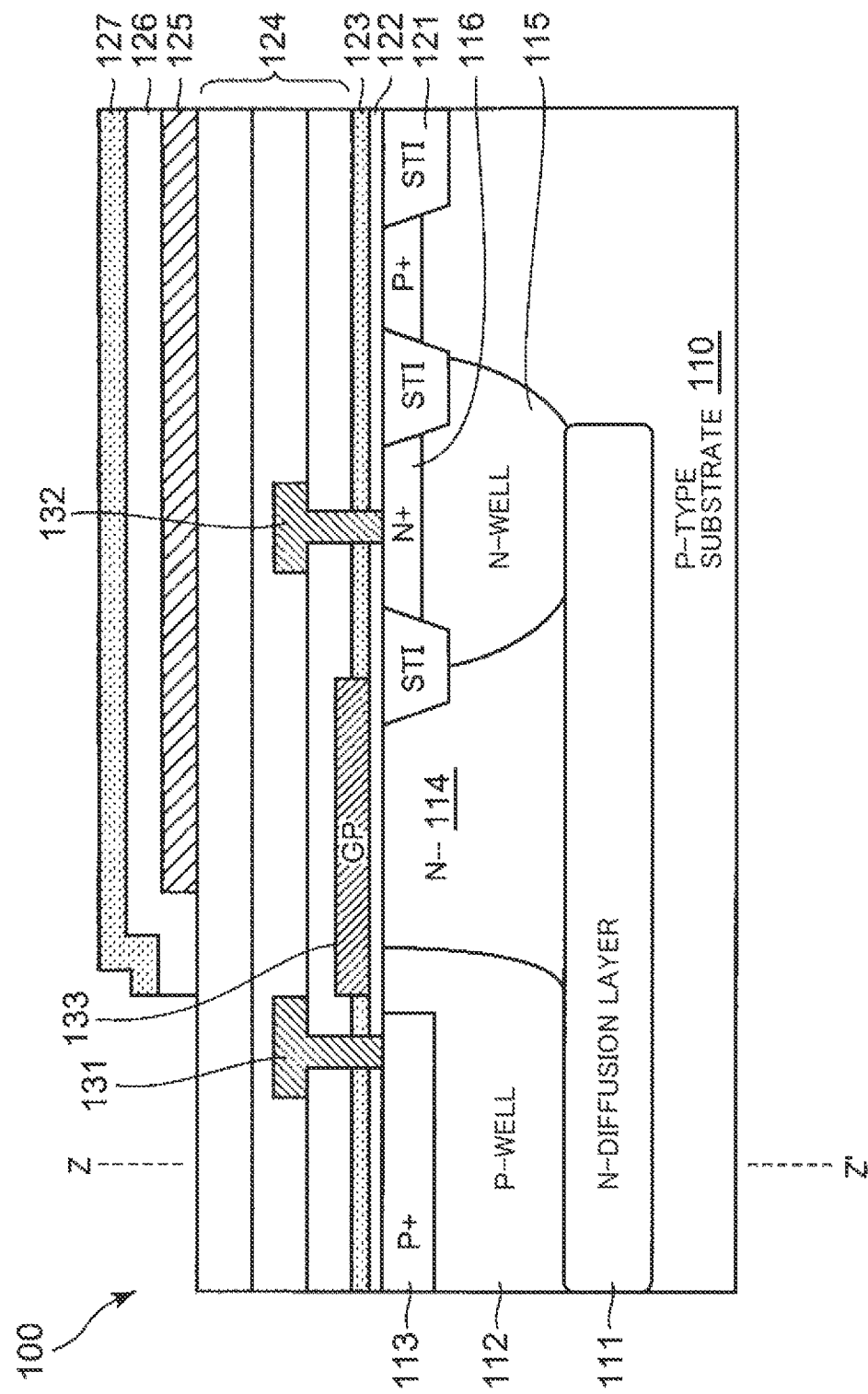
FIG. 8 illustrates a structure of a SPAD previously proposed by the applicant.
Figure 9:
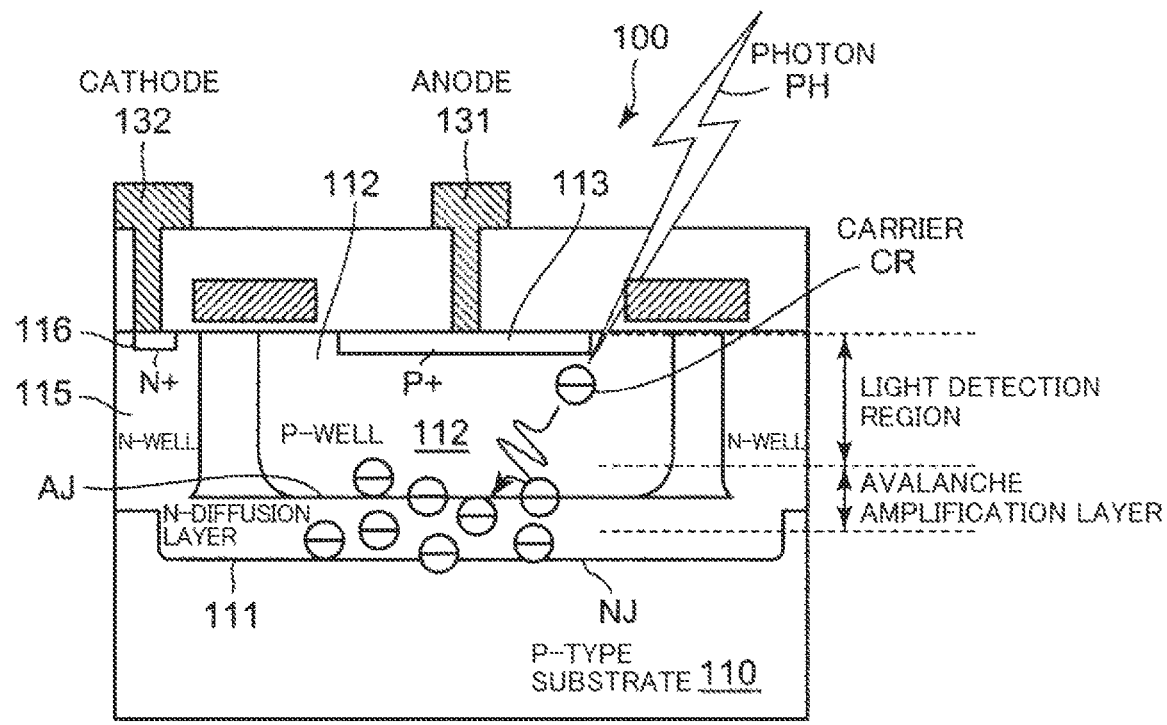
FIG. 9 is a schematic view referenced to explain an avalanche amplification operation performed by the SPAD illustrated in FIG. 8.
Figure 10:
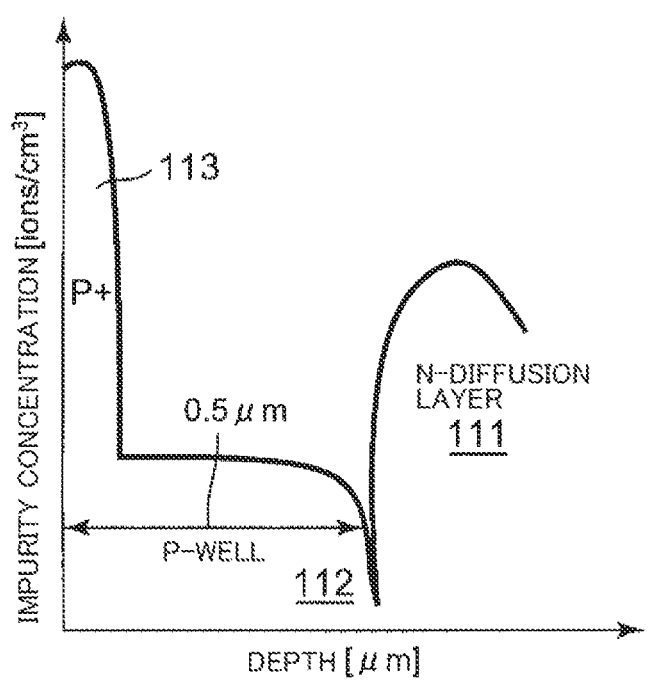
FIG. 10 is a graph representing a depthwise concentration profile of the SPAD illustrated in FIG. 8.
Figure 11:
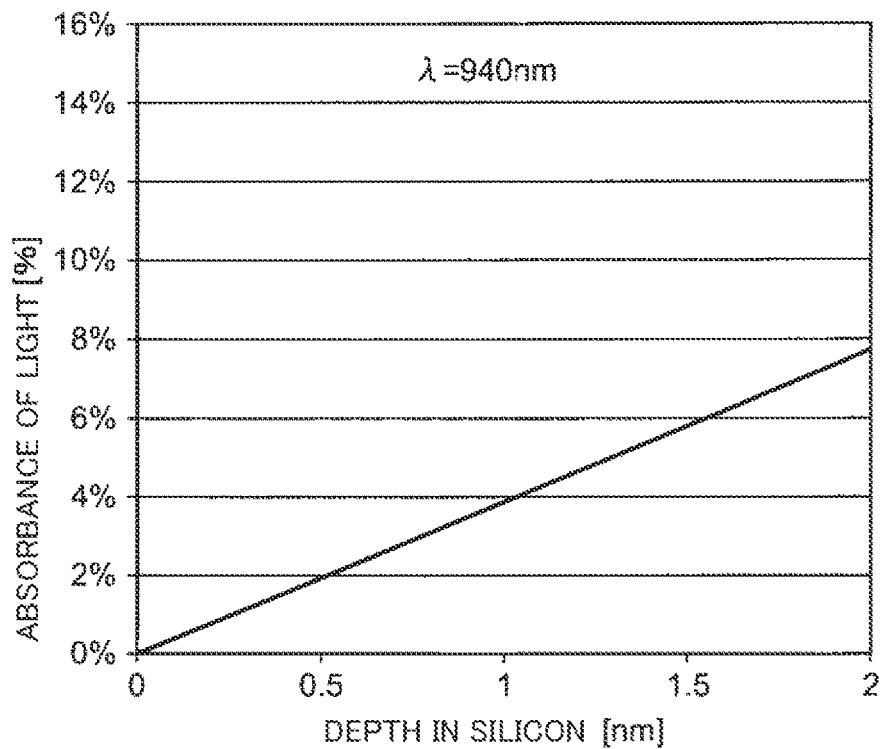
FIG. 11 is a graph representing dependence, on depth, of the absorbance of light having a wavelength $\lambda=940$ nm and coming into silicon.
Figure 12:
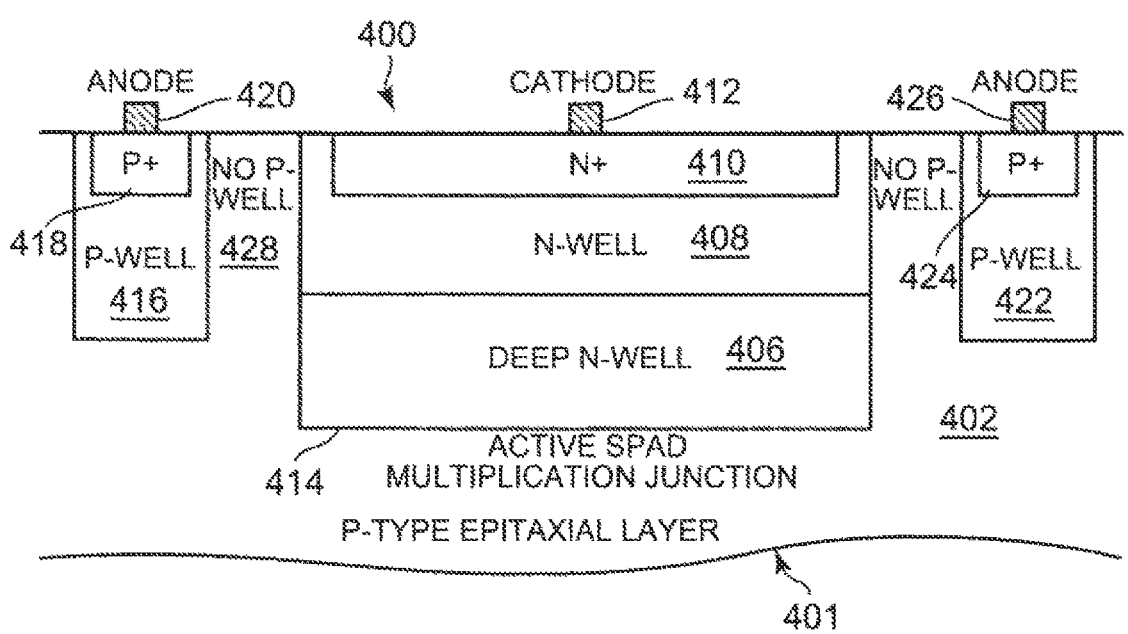
FIG. 12 illustrates a structure of another known SPAD.
Figure 13:
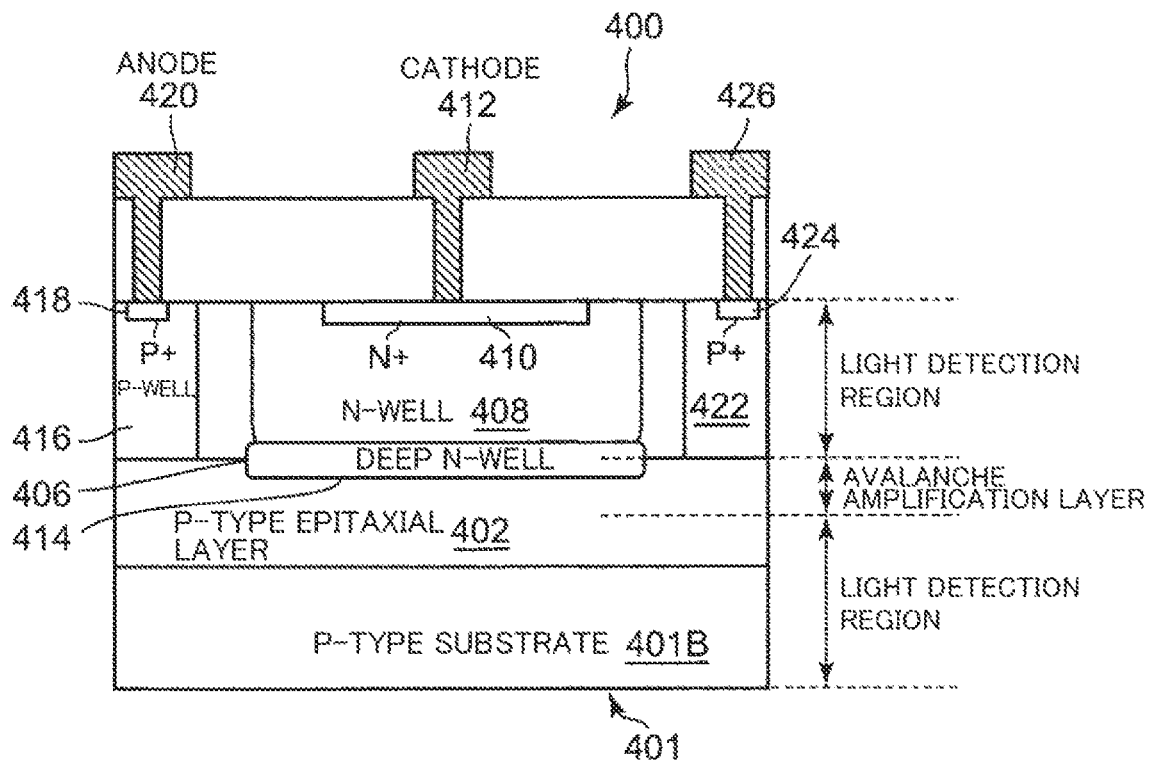
FIG. 13 is a schematic view referenced to explain an avalanche amplification operation performed by the SPAD illustrated in FIG. 12.
Figure 14:
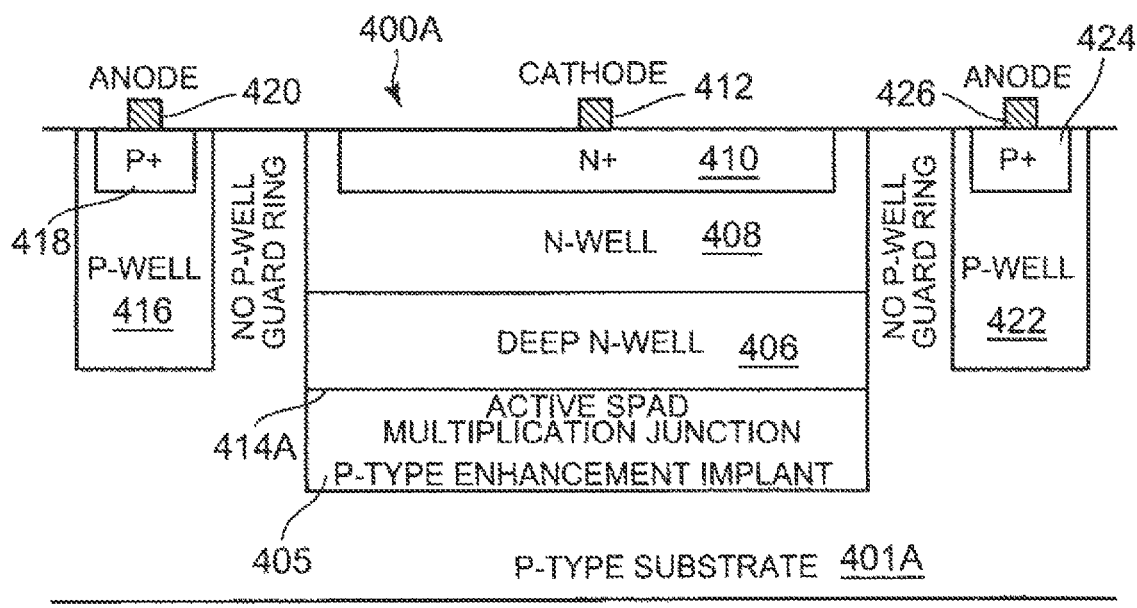
FIG. 14 illustrates a structure of still another known SPAD.

When the internal resistance of the SPAD is large as in the related art (SPAD in each of FIGS. 8 and 14), the maximum amplification current is suppressed to a low level as denoted by a dotted line G0 in FIG. 3. In contrast, when the internal resistance of the SPAD is small as in the SPAD 90 according to the present invention, the maximum amplification current (current value in the On-state) can be increased as denoted by a solid line G1 in FIG. 3.

Each of FIGS. 4A and 4B represents a result of observing an output of the avalanche photodiode APD with the lapse of time in the case of inputting a pulse in the absence of any input signals. When the quenching resistance (resistance R) is too large as represented in FIG. 4A, a magnitude P0 of the maximum amplification current (pulse output) is small. In contrast, when the quenching resistance (resistance R) is appropriate as represented in FIG. 4B, a magnitude P1 of the maximum amplification current (pulse output) is large. The presence or the absence of the output signal (pulse output) can be determined as a binary value of "1" or "0" by properly setting a threshold a between a baseline BL and a maximum value (P1) of the output signal.

Second Embodiment

Figure 6:
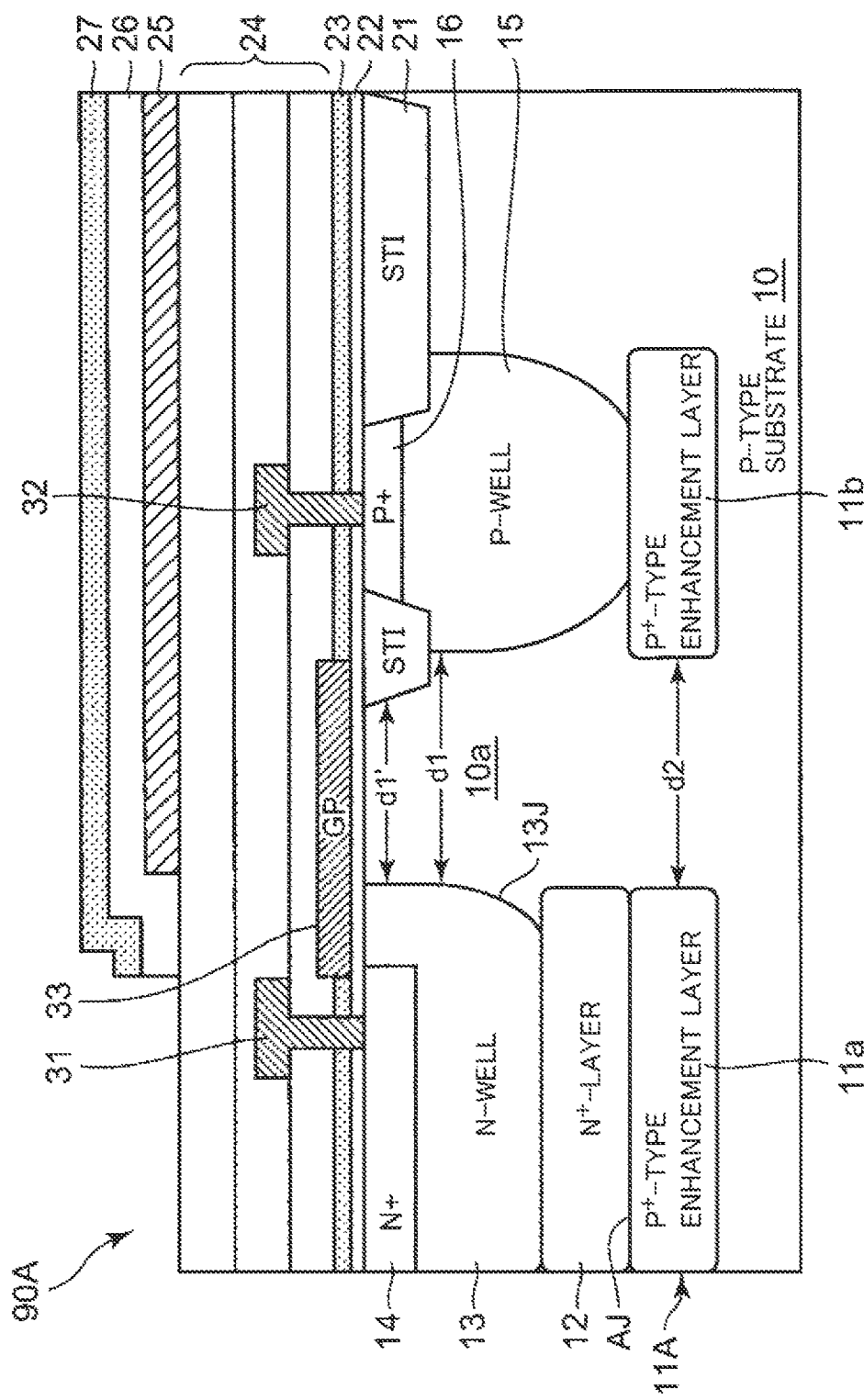
FIG. 6 is a sectional view illustrating a structure of an avalanche photodiode according to a second embodiment of the present invention.

FIG. 6 illustrates a sectional structure of an avalanche photodiode (SPAD) 90A according to a second embodiment of the present invention. The same elements as those in FIG. 1 are denoted by the same reference signs in FIG. 6, and duplicate description is omitted.

The SPAD 90A is different from the SPAD 90 illustrated in FIG. 1 in that a first portion 11a of a P$^+$-type enhancement layer 11A locating just under the N$^+$-layer 12 and a second portion 11b of the P$^+$-type enhancement layer 11A locating just under the P-well 15 are spaced from each other through a distance d2 (about 2 μm) in the lateral direction. The other structure of the SPAD 90A is the same as that of the SPAD 90 illustrated in FIG. 1.

In manufacturing of the SPAD 90A, an implantation mask used in a step of forming the P$^+$-type enhancement layer 11A by ion implantation is changed from an implantation mask used to form the P$^+$-type enhancement layer 11 of the SPAD 90 illustrated in FIG. 1. The changed mask is designed so as to prevent ions from being implanted to a region corresponding to the above-mentioned distance d2 inside the P-type substrate 10. The other manufacturing steps for the SPAD 90A are the same as those for the SPAD 90 illustrated in FIG. 1.

In the SPAD 90A, there is no high-concentration (P$^+$) layer between the first portion of the P$^+$-type enhancement layer 11A locating just under the N$^+$-layer 12 and the second portion of the P$^+$-type enhancement layer 11A locating just under the P-well 15. With such a structure, impurities can be prevented from diffusing and spreading into the region between the N-well 13 and the P-well 15 (i.e., the region becoming the non-doped region 10a) from below in a manufacturing stage of the avalanche photodiode. In the manufactured SPAD 90A, therefore, a strong electric field is not applied to the lateral surfaces of the N$^+$-layer 12 and the N-well 13, and a uniform electric field can be applied to the junction AJ between the P$^+$-type enhancement layer 11 and the N$^+$-layer 12. As a result, the noise during the operation can be suppressed.

Third Embodiment

Figure 7:
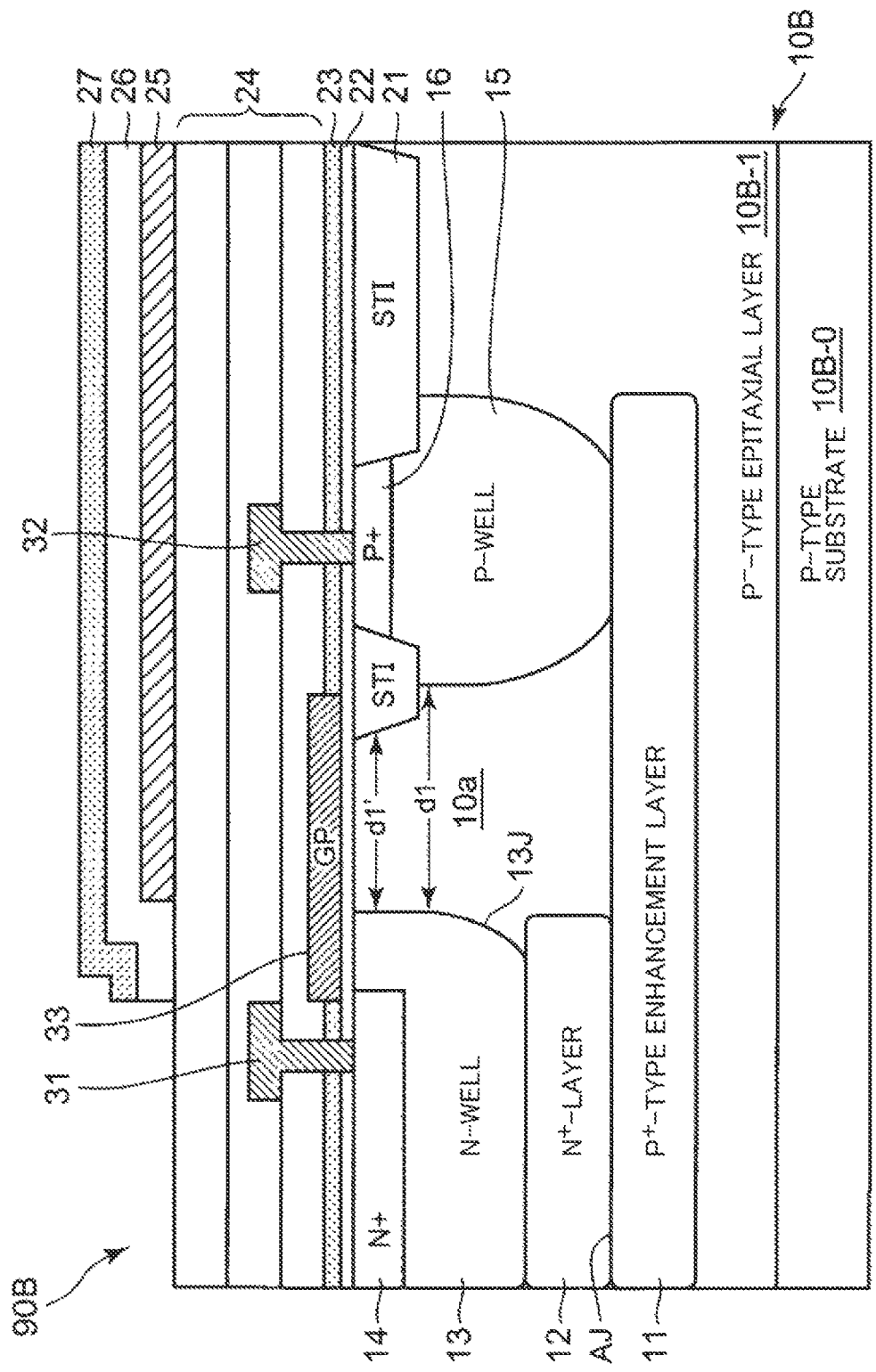
FIG. 7 is an illustration, i.e., a sectional view illustrating a structure of an avalanche photodiode according to a third embodiment of the present invention.

FIG. 7 illustrates a sectional structure of an avalanche photodiode (SPAD) 90B according to a third embodiment of the present invention. The same elements as those in FIG. 1 are denoted by the same reference signs in FIG. 7, and duplicate description is omitted.

The SPAD 90B is different in using an epitaxial substrate 10B instead of the P-type substrate 10 of the SPAD 90 illustrated in FIG. 1. The epitaxial substrate 10B is constituted by laminating, on a P-type substrate (silicon) 10B-0 having a uniform impurity concentration corresponding to specific resistance of 0.1 Ω·cm, an epitaxial layer (silicon) 10B-1 having a thickness of 5 μm and a uniform impurity concentration corresponding to specific resistance of 10 Ω·cm by an epitaxial growth method. The SPAD 90B is built in the epitaxial layer 10B-1 serving as a substrate semiconductor layer.

In the epitaxial layer 10B-1 in which the SPAD 90B is built, there are relatively few defects. Accordingly, generation of the carriers attributable to the defects (acting as the recombination centers) can be suppressed. As a result, the noise (dark current rate) during the operation can be further suppressed.

In an ordinary bulk substrate (e.g., the P-type substrate 10), a problem arises because a response speed is delayed by the so-called delayed carriers, i.e., carriers generated inside the substrate (in a portion lower than the P$^+$-type enhancement layer 11) and taking a longer time until reaching the junction AJ between the P-type enhancement layer 11 and the N$^+$-layer 12 at which the electric field intensity is high. In the above-described epitaxial substrate 10B, however, it is possible to annihilate the delayed carriers in the P-type substrate 10B-0 having the high impurity concentration. Accordingly, the SPAD 90B is suitably used in the case of requiring a high-speed response, such as the TOF sensor.

[Recapitulation of Invention]

As is apparent from the above description, an avalanche photodiode according to the present invention includes:

a first semiconductor layer formed inside a substrate semiconductor layer having a first conductivity type and a uniform impurity concentration, the first semiconductor layer having the first conductivity type and occupying a predetermined region in a lateral direction;

a second semiconductor layer having a second conductivity type opposite to the first conductivity type and formed inside the substrate semiconductor layer on the first semiconductor layer in contact therewith;
a third semiconductor layer having the second conductivity type, the third semiconductor layer being formed inside the substrate semiconductor layer on the second semiconductor layer in contact therewith and having a lower impurity concentration than the second semiconductor layer;
a fourth semiconductor layer having the second conductivity type, the fourth semiconductor layer being formed in a shallow portion of the third semiconductor layer and having a higher impurity concentration than the third semiconductor layer;
a fifth semiconductor layer having the first conductivity type and formed inside the substrate semiconductor layer at a position away from the third semiconductor layer in the lateral direction;
a sixth semiconductor layer having the first conductivity type, the sixth semiconductor layer being formed in a shallow portion of the fifth semiconductor layer and having a higher impurity concentration than the fifth semiconductor layer;
a first contact electrically connected to the fourth semiconductor layer; and
a second contact electrically connected to the sixth semiconductor layer,
wherein the first semiconductor layer is positioned just under the second semiconductor layer and the fifth semiconductor layer in contact therewith, and an avalanche phenomenon is caused at a junction between the first semiconductor layer and the second semiconductor layer.

In the avalanche photodiode according to the present invention, the junction causing the avalanche phenomenon (i.e., the junction between the first semiconductor layer and the second semiconductor layer) is present inside the substrate semiconductor layer. Therefore, optical carriers attributable to light absorbed inside the substrate semiconductor layer contribute to the avalanche phenomenon and increase photon detection efficiency. As a result, optical sensitivity increases.

Furthermore, the substrate semiconductor layer has the uniform impurity concentration. The first semiconductor layer and the second semiconductor layer can be formed in a manner of controlling their concentrations and depthwise positions by an ion implantation method. Accordingly, a variation in concentration at the junction causing the avalanche phenomenon (i.e., the junction between the first semiconductor layer and the second semiconductor layer) is reduced, and a variation in manufacturing is reduced. This stabilizes electric field intensity at the junction casing the avalanche phenomenon. As a result, the optical sensitivity is stabilized.

Moreover, since the first semiconductor layer is a lower resistance layer in comparison with the substrate semiconductor layer, electrical resistance of a path (including the first semiconductor layer and the fifth semiconductor layer) from the junction causing the avalanche phenomenon (i.e., the junction between the first semiconductor layer and the second semiconductor layer) to the sixth semiconductor layer can be significantly reduced. Thus, internal resistance can be reduced, and a maximum amplification current can be increased.

In an avalanche photodiode according one embodiment, a non-doped region having the same impurity concentration as the substrate semiconductor layer is present between the third semiconductor layer and the fifth semiconductor layer in the lateral direction inside the substrate semiconductor layer.

In the above avalanche photodiode according one embodiment, the non-doped region having the same impurity concentration as the substrate semiconductor layer is present between the third semiconductor layer and the fifth semiconductor layer in the lateral direction inside the substrate semiconductor layer. Since the non-doped region has the lower concentration than the first semiconductor layer and the fifth semiconductor layer, the concentrations at the junctions in lateral surfaces of the second semiconductor layer and the third semiconductor layer are reduced, and electric fields in those lateral surfaces are moderated. It is hence possible to avoid the electric field from increasing only at those lateral surfaces (particularly, the occurrence of the edge breakdown), and to widen the electric field at the junction causing the avalanche phenomenon (i.e., the junction between the first semiconductor layer and the second semiconductor layer). Accordingly, a wide effective area of the junction causing the avalanche phenomenon can be secured, and the photon detection efficiency can be increased. Hence the optical sensitivity can be further increased.

In an avalanche photodiode according to one embodiment, a first portion of the first semiconductor layer locating just under the second semiconductor layer and a second portion of the first semiconductor layer locating just under the fifth semiconductor layer are connected to each other in the lateral direction.

In the above avalanche photodiode according to one embodiment, the first portion of the first semiconductor layer locating just under the second semiconductor layer and the second portion of the first semiconductor layer locating just under the fifth semiconductor layer are connected to each other in the lateral direction. Therefore, the resistance of the first semiconductor layer is further reduced in the lateral direction, and the electrical resistance of the path (including the first semiconductor layer and the fifth semiconductor layer) from the junction causing the avalanche phenomenon (i.e., the junction between the first semiconductor layer and the second semiconductor layer) to the sixth semiconductor layer can be more significantly reduced. Thus, the internal resistance can be further reduced, and the maximum amplification current can be further increased.

In an avalanche photodiode according to one embodiment, a first portion of the first semiconductor layer locating just under the second semiconductor layer and a second portion of the first semiconductor layer locating just under the fifth semiconductor layer are spaced from each other in the lateral direction.

In the above avalanche photodiode according to one embodiment, the first portion of the first semiconductor layer locating just under the second semiconductor layer and the second portion of the first semiconductor layer locating just under the fifth semiconductor layer are spaced from each other in the lateral direction. Thus, there is no high-concentration layer between the first portion of the first semiconductor layer locating just under the second semiconductor layer and the second portion of the first semiconductor layer locating just under the fifth semiconductor layer. With such a structure, impurities can be prevented from diffusing and spreading into a region between the third semiconductor layer and the fifth semiconductor layer (i.e., the region becoming the non-doped region) from below in a manufacturing stage of the avalanche photodiode. In the manufactured avalanche photodiode, therefore, a strong electric field is not applied to the lateral surfaces of the second semiconductor layer and the third semiconductor layer, and a uniform electric field can be applied to the junction between the first semiconductor layer and the second semiconductor layer. As a result, noise during the operation can be suppressed.

In an avalanche photodiode according to one embodiment, the fifth semiconductor layer is positioned to surround the third semiconductor layer with a spacing held therebetween in the lateral direction inside the substrate semiconductor layer, and a shallow trench isolation region for element isolation is formed along each of an inner periphery and an outer periphery of a surface portion of the fifth semiconductor layer in contact therewith and is positioned away from the third semiconductor layer in the lateral direction.

A junction is present between the lateral surface of the third semiconductor layer and the substrate semiconductor layer (or the non-doped region). The electric field intensity is maximized near the junction. Therefore, if defects (acting as recombination centers) exist near the junction, carriers attributable to the defects generate and jump into that electric field, thus causing noise. A shallow trench isolation region for element isolation formed by microprocessing has a structure that an oxide film is buried in the trench form. Accordingly, many defects caused by stress and damage exist around the shallow trench isolation region. Taking the above-described point into account, in the above avalanche photodiode according to one embodiment, the shallow trench isolation region for element isolation is positioned away from the third semiconductor layer in the lateral direction. Such a structure can suppress generation of the carriers attributable to the defects. Hence the noise during the operation can be further suppressed. On the other hand, the shallow trench isolation region is positioned along the inner periphery (and the outer periphery) of the surface portion of the fifth semiconductor layer. As a result, a withstand voltage (breakdown voltage) between the third semiconductor layer and the fifth semiconductor layer can be secured.

In an avalanche photodiode according to one embodiment, the substrate semiconductor layer is an epitaxial layer of an epitaxial substrate.

In the above avalanche photodiode according to one embodiment, since the substrate semiconductor layer is the epitaxial layer of the epitaxial substrate, defects are relatively few. Accordingly, generation of the carriers attributable to the defects can be suppressed. As a result, the noise during the operation can be further suppressed.

In the above embodiments, the substrate semiconductor layer provided by each of the P-type substrate 10 and the epitaxial layer 10B-1 of the epitaxial substrate 10B is described as being made of silicon. However, the present invention is not limited to that case, and materials of the substrate semiconductor layer may be compound semiconductors such as SiC and InGaAs.

The above-described embodiments are merely illustrative and can be variously modified without departing from the scope of the present invention. The above-described embodiments can be each implemented by alone, but those embodiments can also be combined with each other. Moreover, various features in the different embodiments can be each implemented by alone, but those features in the different embodiments can also be combined with each other.

REFERENCE SIGNS LIST 10, 10B-0 P-type substrate
10B epitaxial substrate
10B-1 epitaxial layer
11, 11A $P^+$-type enhancement layer
12, 14 $N^+$-layer
13 N-well
15 P-well
16 $P^+$-layer
21 STI
31 cathode contact electrode
32 anode contact electrode

The invention claimed is:
1. An avalanche photodiode comprising:
a substrate semiconductor layer having a first conductivity type and a uniform impurity concentration;
a first semiconductor layer formed inside the substrate semiconductor layer, the first semiconductor layer having the first conductivity type and occupying a predetermined region in a lateral direction;
a second semiconductor layer having a second conductivity type opposite to the first conductivity type and formed inside the substrate semiconductor layer on the first semiconductor layer in contact with the first semiconductor layer;
a third semiconductor layer having the second conductivity type, the third semiconductor layer being formed inside the substrate semiconductor layer on the second semiconductor layer in contact with the second semiconductor layer and having a lower impurity concentration than the second semiconductor layer;
a fourth semiconductor layer having the second conductivity type, the fourth semiconductor layer being formed in a shallow portion of the third semiconductor layer and having a higher impurity concentration than the third semiconductor layer;
a fifth semiconductor layer having the first conductivity type and formed inside the substrate semiconductor layer at a position away from the third semiconductor layer in the lateral direction;
a sixth semiconductor layer having the first conductivity type, the sixth semiconductor layer being formed in a shallow portion of the fifth semiconductor layer and having a higher impurity concentration than the fifth semiconductor layer;
a first contact electrically connected to the fourth semiconductor layer; and
a second contact electrically connected to the sixth semiconductor layer,
wherein the first semiconductor layer is positioned just under the second semiconductor layer and the fifth semiconductor layer in contact with the second semiconductor layer and the fifth semiconductor layer, and an avalanche phenomenon is caused at a junction between the first semiconductor layer and the second semiconductor layer, and
wherein the first semiconductor layer has a first portion locating just under the second semiconductor layer and a second portion locating just under the fifth semiconductor layer, and the first portion and the second portion are spaced from each other in the lateral direction.

2. The avalanche photodiode according to claim 1, wherein a region having the same impurity concentration as the substrate semiconductor layer is present between the third semiconductor layer and the fifth semiconductor layer in the lateral direction inside the substrate semiconductor layer.

3. The avalanche photodiode according to claim 1, wherein the fifth semiconductor layer is positioned to surround the third semiconductor layer with a spacing held therebetween in the lateral direction inside the substrate semiconductor layer, and a shallow trench isolation region for element isolation is formed along each of an inner periphery and an outer periphery of a surface portion of the fifth semiconductor layer, the shallow trench isolation region in contact with the inner periphery and the outer periphery, and is positioned away from the third semiconductor layer in the lateral direction.

4. The avalanche photodiode according to claim 1, wherein the substrate semiconductor layer is an epitaxial layer formed on a semiconductor substrate, and the epitaxial layer has fewer defects than the semiconductor substrate.

5. The avalanche photodiode according to claim 1, wherein an impurity concentration of the first semiconductor layer is lower than an impurity concentration of the second semiconductor layer.

* * * * *